United States Patent [19]
Zimmer et al.

[11] Patent Number: 5,317,280
[45] Date of Patent: May 31, 1994

[54] HIGH IMPEDANCE CIRCUIT USING PFET

[75] Inventors: Robert A. Zimmer; Charles E. Moore, both of Loveland, Colo.

[73] Assignee: Hewlett-Packard Company, Palo Alto, Calif.

[21] Appl. No.: 125,045

[22] Filed: Sep. 21, 1993

[51] Int. Cl.$^5$ .............................................. H03F 3/45
[52] U.S. Cl. .................................. 330/261; 330/292; 330/277; 330/296
[58] Field of Search ............... 330/261, 292, 296, 277, 330/310, 185, 76; 307/296.1, 296.5

[56] References Cited

U.S. PATENT DOCUMENTS 4,521,741 6/1985 Ruberl .................................. 330/277

Primary Examiner—James B. Mullins
Assistant Examiner—James Dudek

[57] ABSTRACT

A circuit provides a high impedance input to an operational amplifier by substituting a p-channel field effect transistor for the bias resistor normally used on the input to an operation amplifier. By placing a PFET in place of the bias resistor, a resistance value can be created that is hundreds of times higher, for the same area of silicon within the integrated circuit, as that created with an actual resistor. This PFET has parasitic capacitance which may be significantly offset by connecting the gate of the PFET to the output of a source follower circuit having its input connected to the inverting input of the operational amplifier. The circuit may be still further improved by using a voltage follower amplifier circuit in place of the source follower.

11 Claims, 4 Drawing Sheets

HIGH IMPEDANCE CIRCUIT USING PFET

FIELD OF THE INVENTION

This invention relates to electronic circuits and more particularly to MOS integrated circuits. Even more particularly, the invention relates to a high impedance input circuit to an operational amplifier.

BACKGROUND OF THE INVENTION

When a high pass filter is needed on the input to an operational amplifier, a bias resistor, used to bias the input to the operational amplifier, also serves as the resistive component of a high pass RC filter. The capacitive component of the RC filter may be the circuit capacitance of the circuit connected to the input to the operational amplifier, and therefore, may be very small. When the capacitance is very small, and the high pass filter needs to have a very low cutoff frequency, the bias resistor needs to be of a very large value, typically in the 1 gigohm range ($10^9$ ohms). Obtaining gigohm resistance values within an integrated circuit requires a very large amount of space within the integrated circuit.

Prior art devices, such as those shown in FIGS. 1 and 2, described below, typically use bootstrapping to create an effective large resistance. Using the technique of bootstrapping, the effective resistance of the bias resistor is multiplied by a ratio of two resistors connected between the inverting input of the operational amplifier and the voltage source, and since this ratio may typically have a value of 50, only a 40 megohm resistor is needed for the bias resistor to accomplish an effective resistance of 1 gigohm. The bootstrap ratio is limited by the offset voltage of the amplifier, and creating a 40 megohm resistor requires considerable amount of integrated circuit space.

A FET may be used to create the resistor, however, this method requires that the FET be of a very large size. Because of the large size, there is a large parasitic capacitance within the FET which acts as a voltage divider, reducing the value of the input signal.

There is need in the art then for a circuit that will provide an equivalent high value bias resistance while requiring far less space than that occupied by creating a resistor within an integrated circuit, and can offset the effect of large parasitic capacitance within a large FET. The present invention meets these and other needs.

SUMMARY OF THE INVENTION

It is an aspect of the present invention to provide a high impedance input circuit to an operational amplifier.

It is another aspect to provide high impedance by replacing a resistor with a field effect transistor (FET) and reducing parasitic capacitance in the FET by using a source follower circuit connected to the gate of the FET.

A still further aspect of the invention is to reduce parasitic capacitance in the FET by using a voltage follower circuit connected to the gate of the FET.

The above and other aspects of the invention are accomplished in a circuit which substitutes a p-channel field effect transistor (PFET) in place of the bias resistor normally used on the input to an operation amplifier. By placing a PFET in place of the bias resistor, a resistance value can be created that is hundreds of times higher, for the same area of silicon within an integrated circuit, as that created with an actual resistor.

Although a PFET creates a large amount of resistance for its size, very large resistance values require that a very large PFET must be constructed within the integrated circuit. This large PFET inherently has large parasitic capacitance, and this large parasitic capacitance forms a voltage divider with the capacitance of the input circuit. The effects of this parasitic capacitance may be significantly reduced by connecting the gate of the PFET to the output of a source follower circuit having its input connected to the inverting input of the operational amplifier.

The circuit may be still further improved by using a voltage follower operational amplifier circuit having its input connected to the inverting input of the operational amplifier, and having its output connected to the gate of the PFET.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
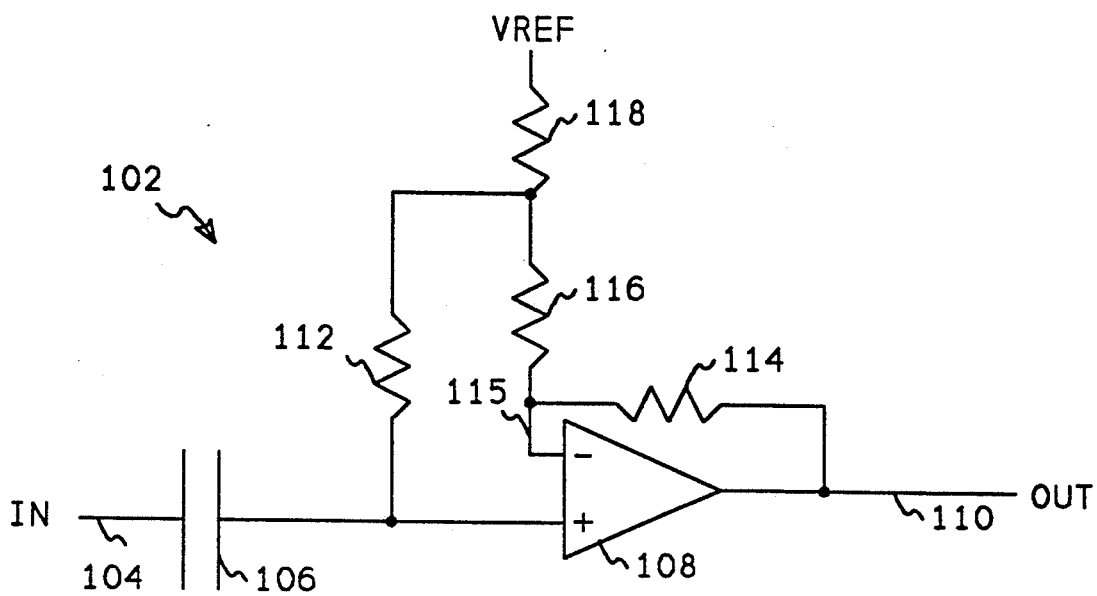
FIG. 1 shows a prior art operational amplifier having a resistive input circuit.

FIG. 1 shows a prior art operational amplifier circuit having a resistive input circuit. Referring now to FIG. 1, an input 104 has a capacitor 106, which may be a separate component, or may be the circuit capacitance of the circuit connected to input 104. A bias resistor 112 is connected to the output of the capacitor 106 and also to the non-inverting input of an operational amplifier 108. The output 110 of the operational amplifier, which is also the circuit output, is connected through a feedback resistor 114 to the inverting input 115 of the operational amplifier 108. Resistors 116 and 118 along with bias resistor 112 accomplish the bootstrapping effect described in the background of the invention. Bootstrapping, which is well known in the art, effectively multiplies the resistance of bias resistor 112 by the ratio of resistor 118 over resistor 116 plus one. For example, if the ratio of resistor 118 over resistor 116 is 50, the resistance value of resistor 112 is effectively multiplied by 51.

Figure 2:
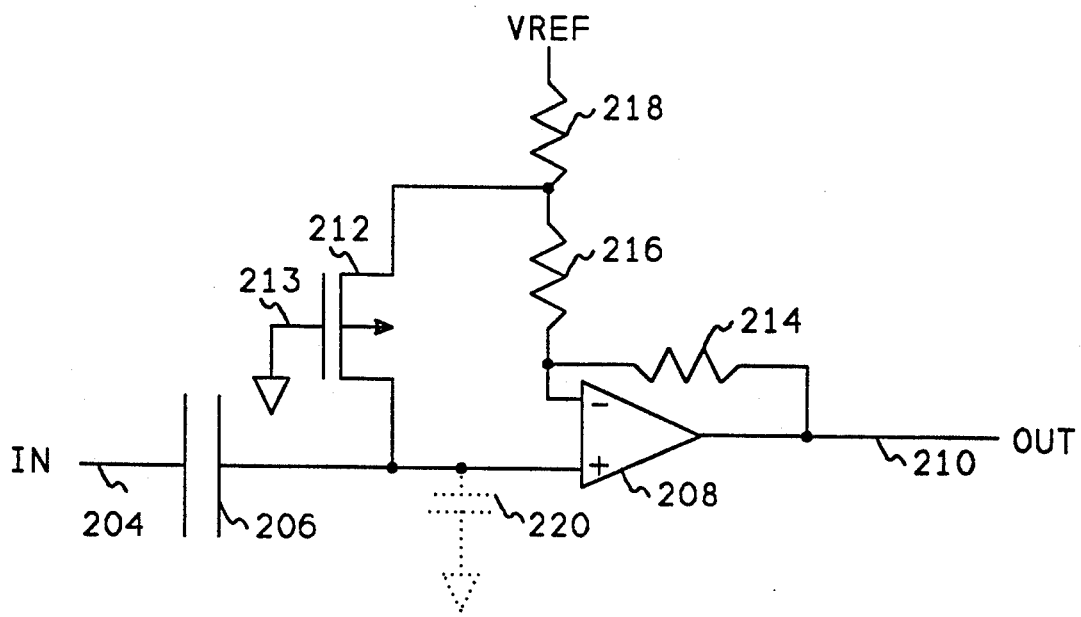
FIG. 2 shows the prior art operational amplifier of FIG. 1 wherein the resistive input circuit of FIG. 1 is replaced by a PFET.

FIG. 2 shows a prior art circuit wherein the resistor 112 of FIG. 1 is replaced by a PFET. Referring now to FIG. 2, an input 204 has an input capacitance 206 and is connected to the non-inverting input of an operational amplifier 208. The output 210 of the operational amplifier 208 is connected through a feedback resistor 214 to the inverting input of the operational amplifier 208. Resistors 216 and 218 form a bootstrapping network in the same manner as resistors 116 and 118 of FIG. 1. A PFET 212 is connected in the circuit of FIG. 2 at the same location where resistor 112 was connected in the circuit of FIG. 1. Gate 213 of the PFET 212 is connected to ground, causing the PFET 212 to conduct and effectively act as a resistor. Thus the capacitor 206 and the PFET 212 form a high pass filter.

If the input capacitance 206 is very small, for example, 7 picofarads, and the high pass filter formed by capacitor 206 and PFET 212 is desired to be a 10 hertz or less high pass filter, then the equivalent resistance value that PFET 212 must create is approximately 2.27 gigohms. Using bootstrapping, however, if the ratio of resistor 218 over resistor 216 is approximately 50, then the resistance value for PFET 212 must be approximately 45.4 megohms to reach an equivalent resistance value of 2 gigohms. To create a resistance value of this magnitude, PFET 212 must be very large, and will therefore have a parasitic capacitance 220 that will be approximately 18 picofarads. Therefore, in this example, input capacitor 206 and the parasitic capacitance 220 of the PFET 212 will create a voltage divider which will cause the voltage on the non-inverting input of the operational amplifier 208 to be only 7/25 of the input signal. This requires operational amplifier 208 to have a larger gain.

The circuit of the present invention improves the circuit of FIG. 2 to reduce the effects of the parasitic capacitor 220, by making the signal change on either side of the capacitor be the same.

Figure 3:
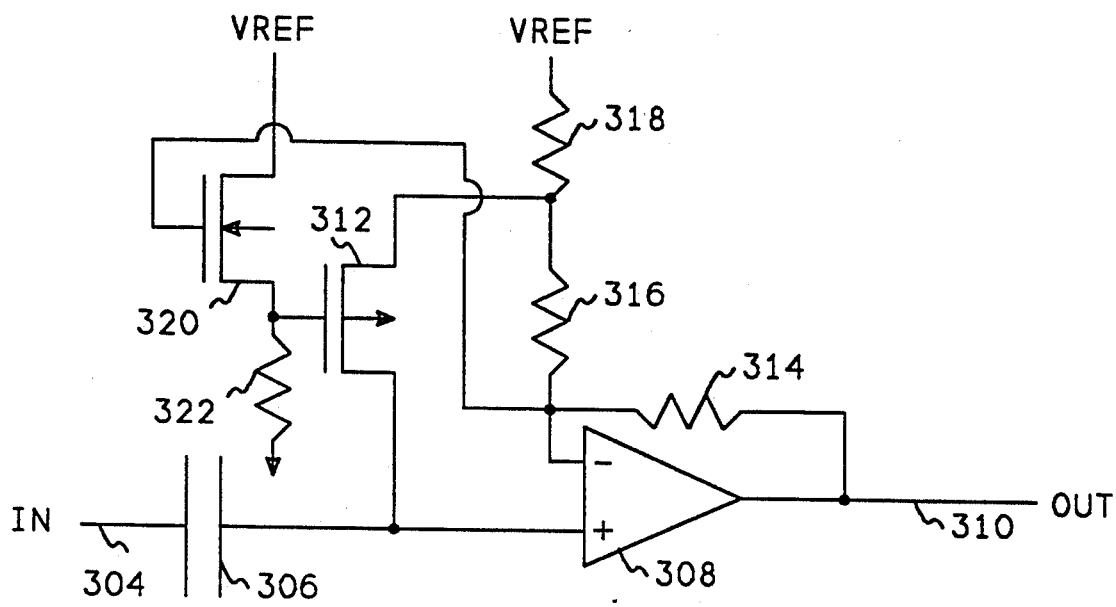
FIG. 3 shows embodiment of the invention wherein a source follower circuit is added to the gate of the PFET.

FIG. 3 shows one embodiment of the invention wherein a source follower circuit is added to the gate of the PFET. Referring now to FIG. 3, the circuit is similar to the circuit of FIG. 2, however, a source follower NFET 320 has been added into the circuit with its source connected to the gate of the PFET 312. The PFET 312 serves the same function in FIG. 3 as PFET 212 serves in FIG. 2. The input to the source follower 320 is connected from the inverting input of the operational amplifier 308, which comes from the non-inverted output of the operational amplifier 308, thus it is in phase with the signal on the non-inverting input of the operational amplifier 308. Bias resistor 322 biases the source of PFET 320. Using this configuration, the gate of PFET 312 has a signal in the same phase as the input signal, therefore the effects of the parasitic capacitance of PFET 312 is greatly reduced.

Figure 4:
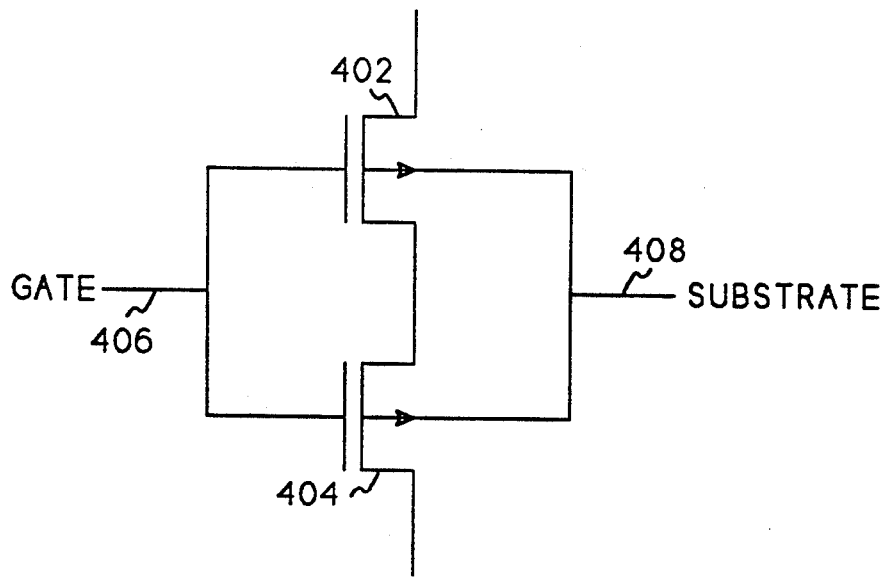
FIG. 4 shows a circuit having two PFETs that replaces the single PFET of FIG. 3.

FIG. 4 shows a circuit having two PFETs that replaces the single PFET 312 of FIG. 3 or replaces the single PFET 212 of FIG. 2. Referring now to FIG. 4, a PFET 402, and a PFET 404, are connected in series. The gates of both of these PFETs are connected together as gate 406, which is connected in the same manner as the gate of PFET 212 or the gate of PFET 312. Also, the substrates of both PFETs are connected together as substrate connection 408, which is connected in the same manner as the substrate of PFET 212 or the substrate of PFET 12.

Figure 5:
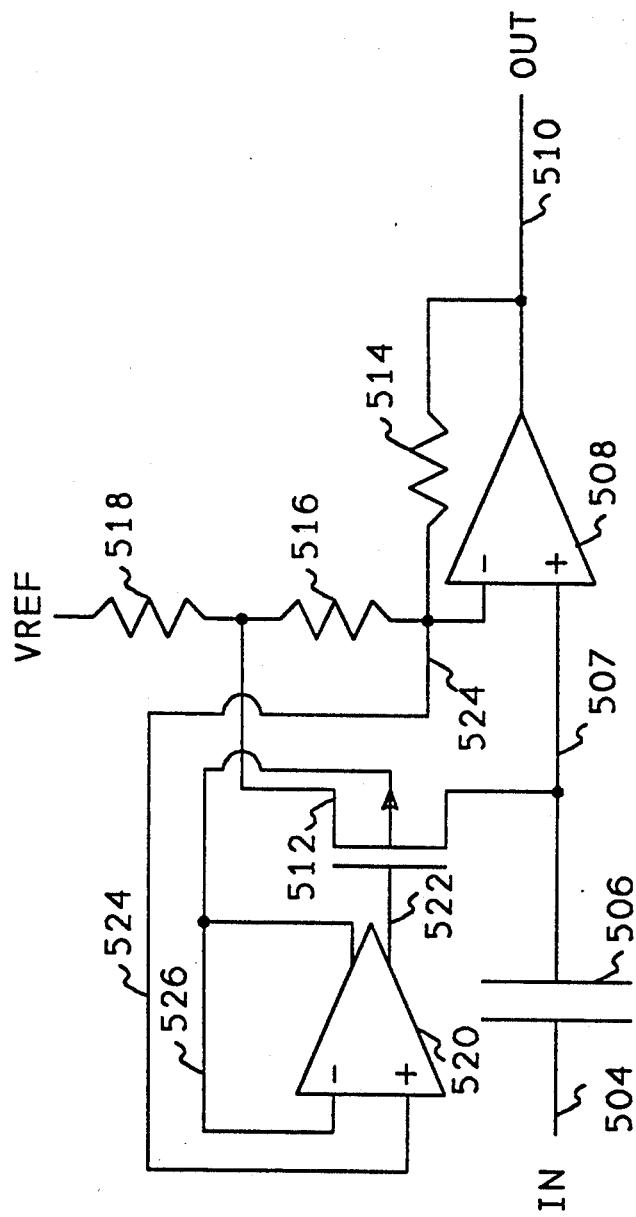
FIG. 5 shows another embodiment of the invention wherein a voltage follower circuit is used in place of the source follower circuit of FIG. 3.

Although the circuit of FIG. 3, which has a source follower, improves the characteristics over the circuit of FIG. 2, further improvement can be accomplished. FIG. 5 shows another embodiment of the invention wherein a voltage follower circuit is used in place of the source follower circuit of FIG. 3. The voltage follower drives both the gate and substrate to cancel the parasitic capacitance, and FETs within the voltage follower 520 are suitably constructed to achieve better process matching.

Referring now to FIG. 5, the circuit is very similar to the circuit of FIG. 3, except that voltage follower circuit 520 replaces the source follower which is comprised of PFET 320 and resistor 322 of FIG. 3. The voltage follower circuit has two outputs. Output 522 is connected to the gate of PFET 512, and output 526 is connected to the substrate and also connected as a feedback input to the voltage follower 520. The AC signal on these two outputs is the same, which cancels the effects of the parasitic capacitance of FET 512. The DC signal is different, however, since signal 522 must bias the FET 512 into a linear mode of operation.

Figure 6:
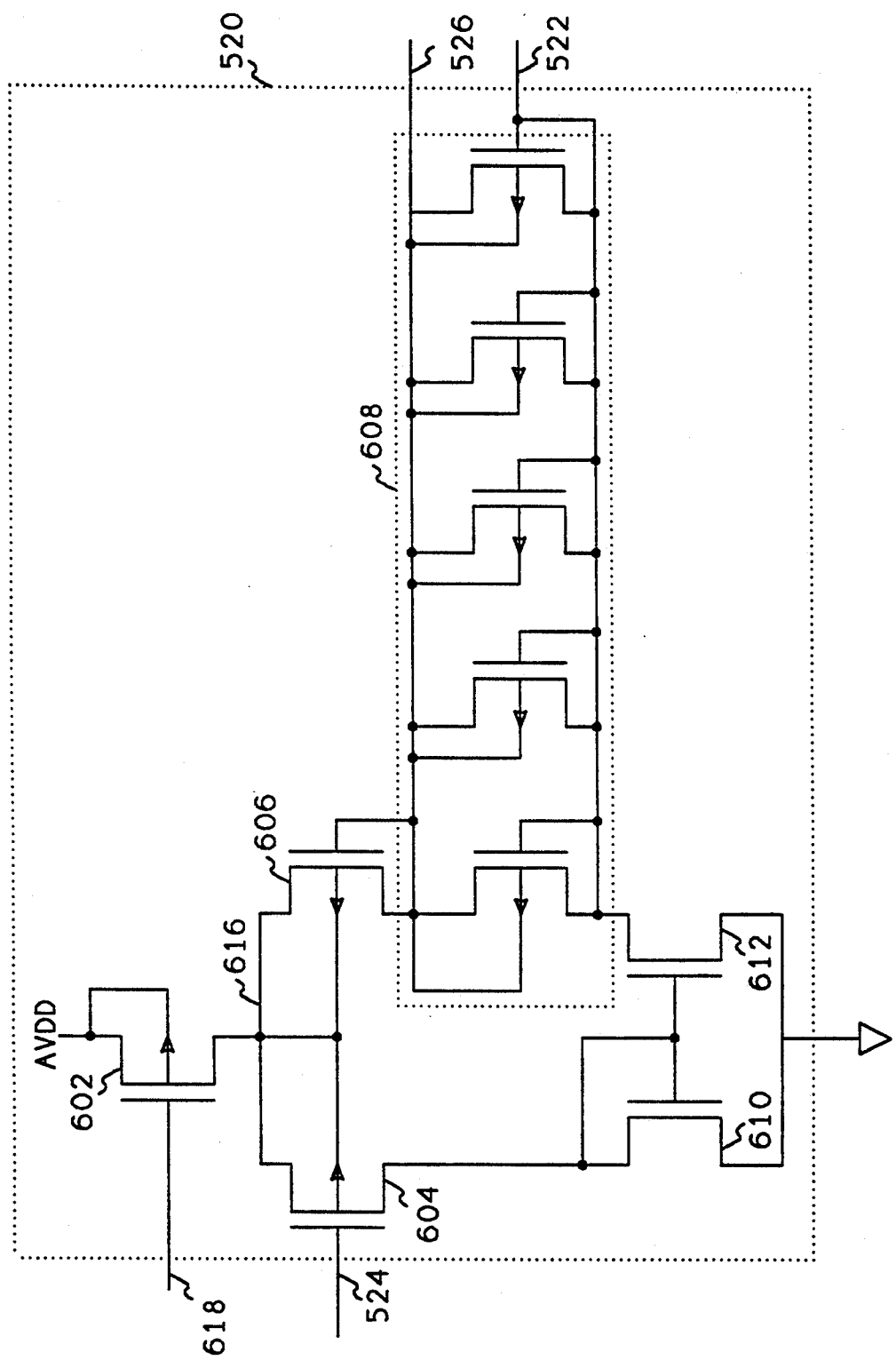
FIG. 6 shows a circuit diagram of a voltage follower circuit used in the circuit of FIG. 5.

FIG. 6 shows a circuit diagram of the voltage follower circuit 520. Referring now to FIG. 6, the voltage follower circuit 520 has a bias PFET 602 used to bias the source of PFET of 604 and PFET 606. Input 618 to the PFET 602 is a DC bias voltage, set to control the amount of current through the circuit. Additional bias PFETs 610 and 612 are used to bias the drain of PFET 604 and 606. Five PFETs in parallel, surrounded by dotted line 608, are used to match characteristics of FET 512. The width of FET 512 is the same as the width of each of the FETs within the dotted line 608, for better process matching, and the length of FET 512 is much longer than the length of each of the FETS within doted line 608. The FETs 608 act like five times the width of FET 512.

In operation, current through FET 602, which is controlled by DC bias voltage 618, is divided equally between FET 604 and FET 606. The current through FET 606 is the same as the current through the FETs within dotted line 608, so current through FET 608, $I_{608}$, is half the current through FET 602 thus:

$$\tfrac{1}{2}I_{602} = I_{608} \qquad (1)$$

The current through FETs 608, which is in the saturated mode of operation, is represented by the equation:

$$\tfrac{1}{2}I_{602} = I_{608} \tfrac{1}{2} C_{ox}\, \mu p\, (W/L)_{608}\, (V_g - V_t)^2_{608} \qquad (2)$$

where $C_{ox}$ is the gate oxide capacitance and $\mu p$ is the semiconductor hole mobility. W is the width of the FET, L is the length of the FET, $V_g$ is the gate voltage of the FET, and $V_t$ is the gate threshold voltage of the FET. Equation (2) can be solved for $(V_g - V_t)_{608}$ as follows:

$$(V_g - V_t)_{608} = \sqrt{\frac{\tfrac{1}{2} I_{602}}{\tfrac{1}{2} C_{ox}\, \mu p\, (W/L)_{608}}} \qquad (3)$$

The voltage on node 507 (FIG. 5) and the voltage on node 524 and node 526 will be the same, because op amps 508 and 520 are high gain operational amplifiers. This causes the gate to source voltage of FET 512 to be the same as the gate to source voltage of the FETs inside dotted line 608. Therefore, the "on" resistance of FET 512, which is in the linear mode of operation, will be:

$$\frac{1}{R_{512}} = C_{ox}\, \mu p\, (W/L)_{512}\, (V_g - V_t)_{608} \qquad (4)$$

By substituting equation (3) for FET 608 above, the "on" resistance equation becomes:

$$\frac{1}{R_{512}} = C_{ox}\, \mu p\, (W/L)_{512} \sqrt{\frac{I_{602}}{C_{ox}\, \mu p\, (W/L)_{608}}} \qquad (5)$$

which can be expressed as:

$$\frac{1}{R_{512}} = (W/L)_{512} \sqrt{\frac{(C_{ox}\, \mu p)^2\, I_{602}}{C_{ox}\, \mu p\, (W/L)_{608}}} \qquad (6)$$

which can be further expressed as:

$$\frac{1}{R_{512}} = (W/L)_{512} \sqrt{\frac{C_{ox}\, \mu p\, I_{602}}{(W/L)_{608}}} \qquad (7)$$

and then as:

$$\frac{1}{R_{512}} = \sqrt{C_{ox}\, \mu p\, I_{602}\, (W/L)_{512}\, \frac{(W/L)_{512}}{(W/L)_{608}}} \qquad (8)$$

which shows the design characteristics for the transistors, and shows that the process for making the device can be controlled. Since $C_{ox}$ and $\mu p$ are only affected by the square root of their values, their effect is minimized, which makes the process stable.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A high impedance circuit for biasing a non-inverted input to an operational amplifier, said circuit comprising:
    a p-channel field effect transistor having a source connection thereof connected to said non-inverted input to said operational amplifier, and a drain connection thereof connected to a supply voltage; and
    a source follower circuit having an input connected to an inverting input of said operation al amplifier, and having an output connected to a gate of said p-channel field effect transistor.

2. The high impedance circuit of claim 1 wherein said p-channel field effect transistor comprises at least two p-channel field effect transistors connected in series, wherein all gate connections of said at least two p-channel field effect transistors are connected together, and wherein all substrate connections of said at least two p-channel field effect transistors are connected together.

3. In an operational amplifier circuit having a resistive-capacitive high-pass filter connected to a non-inverting input thereof, a circuit for providing a resistive element of said filter, said circuit comprising:
    a p-channel field effect transistor having a source connection thereof connected to said non-inverting input to said operational amplifier, and a drain connection thereof connected to a supply voltage; and
    a source follower circuit having an input connected to an inverting input of said operational amplifier, and having an output connected to a gate of said p-channel field effect transistor.

4. The circuit of claim 3 wherein said p-channel field effect transistor comprises at least two p-channel field effect transistors connected in series, wherein all gate connections of said at least two p-channel field effect transistors are connected together and connected to circuit ground, and wherein all substrate connections of said at least two p-channel field effect transistors are connected together.

5. In an operational amplifier circuit having a resistive-capacitive high-pass filter connected to a non-inverting input thereof, a circuit for providing a resistive element of said filter, said circuit comprising:
    a resistor connected between an output of said operational amplifier and an inverting input of said operational amplifier;
    a pair of resistors connected in series between said inverting input and a supply voltage;
    a p-channel field effect transistor having a source connection thereof connected to said non-inverting input to said operational amplifier, a drain connection thereof connected between said pair of resistors connected in series; and
    a source follower circuit having an input connected to said inverting input of said operational amplifier, and having an output connected to a gate of said p-channel field effect transistor.

6. The circuit of claim 5 wherein said p-channel field effect transistor comprises at least two p-channel field effect transistors connected in series, wherein all gate connections of said at least two p-channel field effect transistors are connected together and connected to said output of said source follower circuit, and wherein all substrate connections of said at least two p-channel field effect transistors are connected together.

7. In an operational amplifier circuit having a resistive-capacitive high-pass filter connected to a non-inverting input thereof, a circuit for providing a resistive element of said filter, said circuit comprising:
    a resistor connected between an output of said operational amplifier and an inverting input of said operational amplifier;
    a pair of resistors connected in series between said inverting input and a supply voltage;
    a p-channel field effect transistor having a source connection thereof connected to said non-inverting input to said operational amplifier, a drain connection thereof connected between said pair of resistors connected in series; and
    a second operational amplifier, connected as a voltage follower, said second operational amplifier having an input connected to said inverting input of said operational amplifier, and having an output connected to a gate of said p-channel field effect transistor.

8. The circuit of claim 7 wherein said p-channel field effect transistor comprises at least two p-channel field effect transistors connected in series, wherein all gate connections of said at least two p-channel field effect transistors are connected together and connected to said output of said operational amplifier, and wherein all substrate connections of said at least two p-channel field effect transistors are connected together.

9. The circuit of claim 7 wherein said second operational amplifier further comprises means for outputing first and second signals, wherein said first signal connects to a gate of said p-channel field effect transistor and contains a DC bias signal, and said second signal connects to a substrate of said p-channel field effect transistor, and further wherein said first and second signals each contain an substantially identical AC signal.

10. The circuit of claim 9 wherein said first and second signals are output by a plurality of parallel field effect transistors within said second operational amplifier.

11. The circuit of claim 9 wherein an inverted input of said second operational amplifier is connected to said second output of said second operational amplifier.

* * * * *